US010128133B1

(12) United States Patent
Haghofer et al.

(10) Patent No.: US 10,128,133 B1
(45) Date of Patent: Nov. 13, 2018

(54) METHOD OF CONDITIONING AN ETCH CHAMBER FOR CONTAMINANT FREE ETCHING OF A SEMICONDUCTOR DEVICE

(71) Applicant: Infineon Technologies Austria AG, Villach (AT)

(72) Inventors: Andreas Haghofer, Bodensdorf (AT); Clemens Ostermaier, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/638,558

(22) Filed: Jun. 30, 2017

(51) Int. Cl.
*G01L 21/30* (2006.01)
*G01R 31/00* (2006.01)
*H01L 21/67* (2006.01)
*H01L 21/687* (2006.01)
*H01L 21/3065* (2006.01)
*H01L 21/306* (2006.01)

(52) U.S. Cl.
CPC .... *H01L 21/67069* (2013.01); *H01L 21/3065* (2013.01); *H01L 21/30621* (2013.01); *H01L 21/687* (2013.01); *H01J 2237/022* (2013.01)

(58) Field of Classification Search
USPC .......................................................... 216/59
See application file for complete search history.

(56) References Cited

U.S. PATENT DOCUMENTS 6,350,697 B1 2/2002 Richardson et al.
2005/0191830 A1* 9/2005 Collins ............. H01J 37/32082
438/514

OTHER PUBLICATIONS

Cunge, G et al., "New chamber walls conditioning and cleaning strategies to improve the stability of plasma processes", Plasma Sources Science and Technologies, vol. 14, Issue 3, Aug. 5, 2005, pp. 599-609.
Ma, Bao-Shan et al., "Wafer Backside Particle Reduction by Optimizing AC3 Coating for Poly Etch Chamber", ECS Transactions, vol. 34, Issue 1, 2011, pp. 439-443.
Ramos, R et al., "Plasma/reactor walls interactions in advanced gate etching processes", Thin Solid Films, vol. 515, Issue 12, Apr. 23, 2007, pp. 4846-4852.
Hayes, T.R., et al., "Reactive Ion Etching of InP using CH4/H2 Mixtures: Mechanisms of Etching and Anisotropy", Journal of Vacuum Science & Technology B: Microelectronics Processing and Phenomena, vol. 7, No. 5, 1989, pp. 1130-1140.

* cited by examiner

*Primary Examiner* — Roberts Culbert
(74) *Attorney, Agent, or Firm* — Murphy, Bilak & Homiller, PLLC

(57) ABSTRACT

An etching tool that includes an interior chamber is provided. A plurality of type III-V semiconductor wafers is provided. A process cycle is performed for each one of the type III-V semiconductor wafers in the plurality. The process cycle includes performing a preliminary contamination control process. The process cycle further includes inserting one of the type III-V semiconductor wafers into the interior chamber. The process cycle further includes etching type III-V semiconductor material away from the type III-V semiconductor wafer that is present in the interior chamber. The process cycle further includes removing the type III-V semiconductor wafer that is present in the interior chamber. The preliminary contamination control process includes forming a carbon containing protective material that completely covers exposed surfaces of the interior chamber.

20 Claims, 8 Drawing Sheets

METHOD OF CONDITIONING AN ETCH CHAMBER FOR CONTAMINANT FREE ETCHING OF A SEMICONDUCTOR DEVICE

TECHNICAL FIELD

The instant application relates to semiconductor devices, and in particular relates to techniques for forming high-electron-mobility semiconductor devices.

BACKGROUND

Semiconductor transistors, in particular field-effect controlled switching devices such as a MISFET (Metal Insulator Semiconductor Field Effect Transistor), in the following also referred to as MOSFET (Metal Oxide Semiconductor Field Effect Transistor) and a HEMT (high-electron-mobility Field Effect Transistor) also known as heterostructure FET (HFET) and modulation-doped FET (MODFET) are used in a variety of applications. An HEMT is a transistor with a junction between two materials having different band gaps, such as GaN and AlGaN. HEMTs are viewed as an attractive candidate for power transistor applications, i.e., applications in which switching of substantially large voltages and/or currents is required. HEMTs offer high conduction and low resistive losses in comparison to conventional silicon based devices. HEMTs are typically formed from III-V semiconductor materials, such as GaN, GaAs, InGaN, AlGaN, etc.

Modern HEMT fabrication techniques require methods for etching type III-V semiconductor materials, such as GaN, GaAs, InGaN, AlGaN, etc. For example, many HEMT devices utilize a recessed gate configuration in which the gate structure is disposed in a recess that is formed in the barrier region of the device. This structure is typically formed by epitaxially growing the type III-V semiconductor layers and etching (either selectively or unselectively) material away from the barrier region to form the recess. Etching of type III-V semiconductor materials is commonly done using plasma and dry etching techniques due to the inertness of the material.

One issue with the etching of type III-V semiconductor materials relates to surface damage. For example, plasma etching of type III-V semiconductor materials can result in highly roughened surfaces with substantially dislocated crystalline material. In addition or in the alternative, plasma etching of type III-V semiconductor materials can create surface structures, e.g., needles or droplets. This surface damage creates an increased number of surface atoms along the etched surface. These surface atoms can serve as electrical traps by reconfiguring their atomic structure and electric charge state during electrical operation.

SUMMARY

A method of fabricating a type III-V semiconductor device is disclosed. According to an embodiment of the method, an etching tool that includes an interior chamber is provided. A plurality of type III-V semiconductor wafers is provided. A process cycle is performed for each one of the type III-V semiconductor wafers in the plurality. The process cycle includes performing a preliminary contamination control process. The process cycle further includes inserting one of the type III-V semiconductor wafers into the interior chamber. The process cycle further includes etching type III-V semiconductor material away from the type III-V semiconductor wafer that is present in the interior chamber. The process cycle further includes removing the type III-V semiconductor wafer that is present in the interior chamber. The preliminary contamination control process includes forming a carbon containing protective material that covers exposed surfaces of the interior chamber.

According to another embodiment of the method, an etching tool that includes an interior chamber is provided. A carbon containing protective material that covers exposed surfaces of the interior chamber is formed. A first type III-V semiconductor wafer is inserted into the interior chamber with the protective material covering the exposed surfaces of the interior chamber. Type III-V semiconductor material is etched away from the first type III-V semiconductor wafer that is contained within the interior chamber while the protective material covers the exposed surfaces of the interior chamber. A first oxygen based ashing step is performed to at least partially remove the protective material from the exposed surfaces of the interior chamber. The preliminary contamination control process includes an in-situ process wherein a first process gas is introduced into the interior chamber. The first process gas forms the carbon containing protective material.

A method of conditioning an etch chamber for each processing cycle during the processing of multiple III-V semiconductor wafers is disclosed. A polymer coating is deposited on an inner surface of the etch chamber via a carbon-containing plasma present in the etch chamber without a III-V semiconductor wafer in the etch chamber. The polymer coating is removed from the inner surface of the etch chamber after a single III-V semiconductor wafer is processed in the etch chamber. The polymer coating deposition and removal processes is repeated for each subsequent III-V semiconductor wafer to be processed in the etch chamber.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
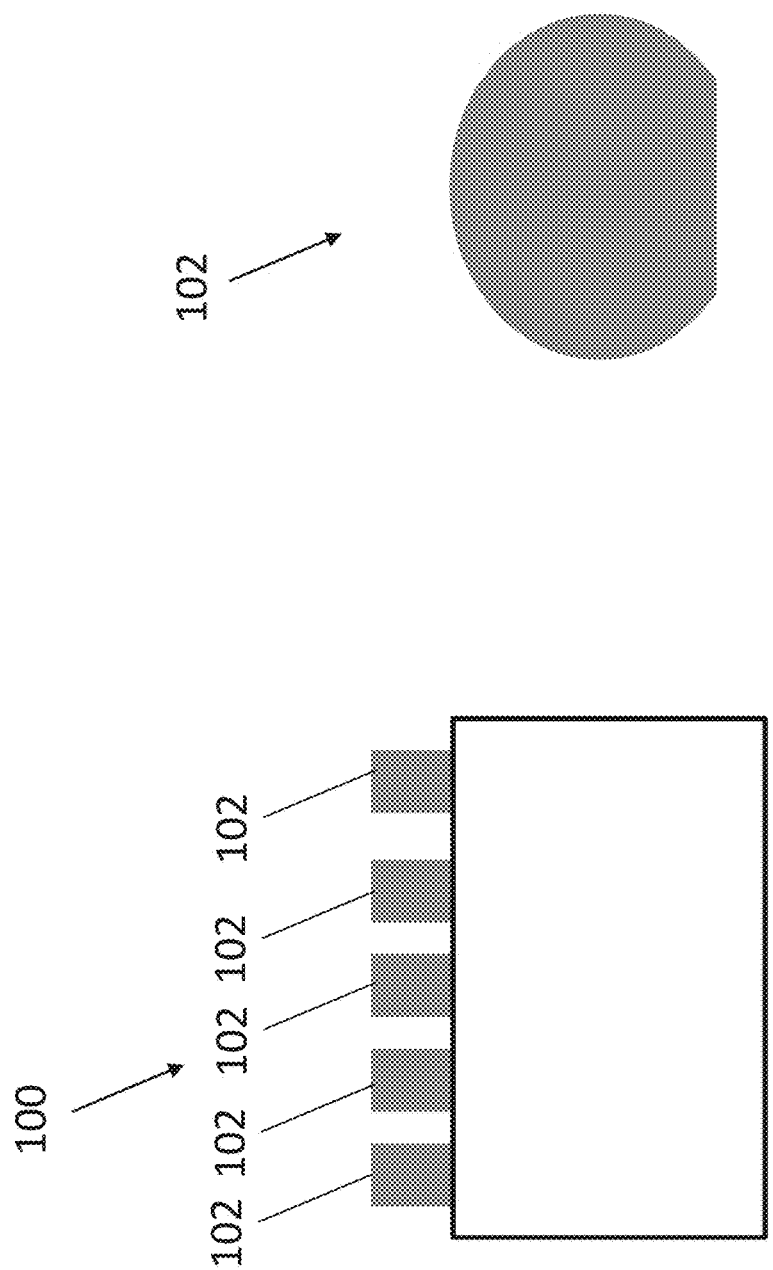
FIG. 1 illustrates a wafer lot with a plurality of semiconductor wafers, according to an embodiment.

According to embodiments described herein, a process cycle for etching a type III-V semiconductor wafer is disclosed. The process cycle includes a preliminary step of conditioning the etch chamber prior to the etching process. This preliminary step of conditioning the etch chamber includes forming a polymer coating on the interior surfaces of the etch chamber. The polymer coating can be formed using an in-situ technique in which process gas, such as a $C_xH_yCl_z$ containing gas mixture, is introduced into the etch chamber using the process gas intake mechanism of the etching tool. The process gas forms a protective polymer coating along the exposed surfaces of the interior chamber. After the protective polymer coating is formed, a wafer is inserted in the etch chamber and an etching process, such as plasma etching, is performed. Subsequently, an oxygen based ashing step can be performed to remove the polymer coating. During this ashing step, at least some of the resistive mask of the wafer can be removed. The same process cycle can be repeated multiple times for the etching of multiple semiconductor wafers.

The above described process cycle advantageously produces a highly controlled and contaminant free environment for the etching process. Moreover, the etching environment is highly consistent as between each semiconductor wafer that is etched in different process cycles. In particular, the embodiments described herein substantially limit and control the amount of residual oxygen that is present in the interior chamber of the etching tool during the etch cycle. Oxygen is a known contaminant that dramatically impacts etch quality and leads to non-desirable etched surfaces including highly roughened surface and/or surface structures. The carbon protective layer substantially limits the number of contaminants such as oxygen in the etching tool by protecting the interior surfaces from being etched and by absorbing free radical state oxygen.

Advantageously, because embodiments of the presently disclosed techniques re-form a protective layer prior to each etching cycle, the conditions of the interior chamber are effectively identical for each etching cycle. Conventionally, protective layers for etch chambers are formed at the beginning of a production cycle. That is, the protective layer is not reformed prior to each subsequent wafer etch in the wafer lot. These methods require the protective layer to be very thick because it must survive multiple etching and ashing cycles. A notable drawback of this technique is that the protective layer gradually disintegrates over multiple etching cycles. Thus, the etch conditions for the etching of each wafer are not identical, as some contaminants tend to accumulate in the protective layer over multiple etch cycles. According to the present techniques, the protective layer can be much thinner, as it only needs to withstand a single etching cycle. Moreover, although the protective layer may partially or completely disintegrate during the ashing step, this does not detrimentally impact the subsequent etching cycle, as a new and substantially contaminant free protective layer is reformed prior to each wafer etch.

Advantageously, the above described process cycle utilizes an in-situ technique to form the protective layer. Conventionally, protective layers for etch chambers are formed using an ex-situ technique whereby, before each wafer lot is processed, a dummy wafer is inserted into the etching tool and a portion of the dummy wafer is etched away, resulting in a residue that forms in the etching tool. One drawback of this technique is that it requires an additional process step of inserting and etching the dummy wafer before each lot is processed, and removing the protective layer after each lot is processed. These steps add significant delay and complication to the etching process. By contrast, the presently disclosed techniques utilize an in-situ technique, they can be seamlessly integrated into the etching process with minimal additional time and expense. Moreover, cleaning of the protective material from the etching tool after each lot is processed is not necessary, as the protective layer can be completely removed by the ashing cycle.

Referring to FIG. 1, a wafer lot 100 and a plan view of one of the semiconductor wafers 102 in the wafer lot 100 are depicted. The wafer lot 100 includes a plurality of identical semiconductor wafers 102. In the depicted embodiment, the wafer lot 100 includes five semiconductor wafers 102. More generally, the wafer lot 100 can include any number of semiconductor wafers 102 greater than two, e.g., 10, 20, 25, 50, etc.

In general, the semiconductor wafers 102 can include any of a wide variety of semiconductor materials, such as silicon (Si), group IV compound semiconductor materials such as silicon carbide (SiC) or silicon germanium (SiGe), type III-V semiconductors including gallium nitride, gallium arsenide (GaAs), aluminium nitride (AlN), aluminium arsenide (AlAs), indium nitride (InN), indium arsenide (InAs), etc. According to an embodiment, each of the semiconductor wafers 102 is a type III-V semiconductor wafer. These wafers 102 may be compound semiconductor wafers that include a silicon base wafer with a number of type III-V semiconductor layers epitaxially grown on the silicon base wafer.

Figure 2:
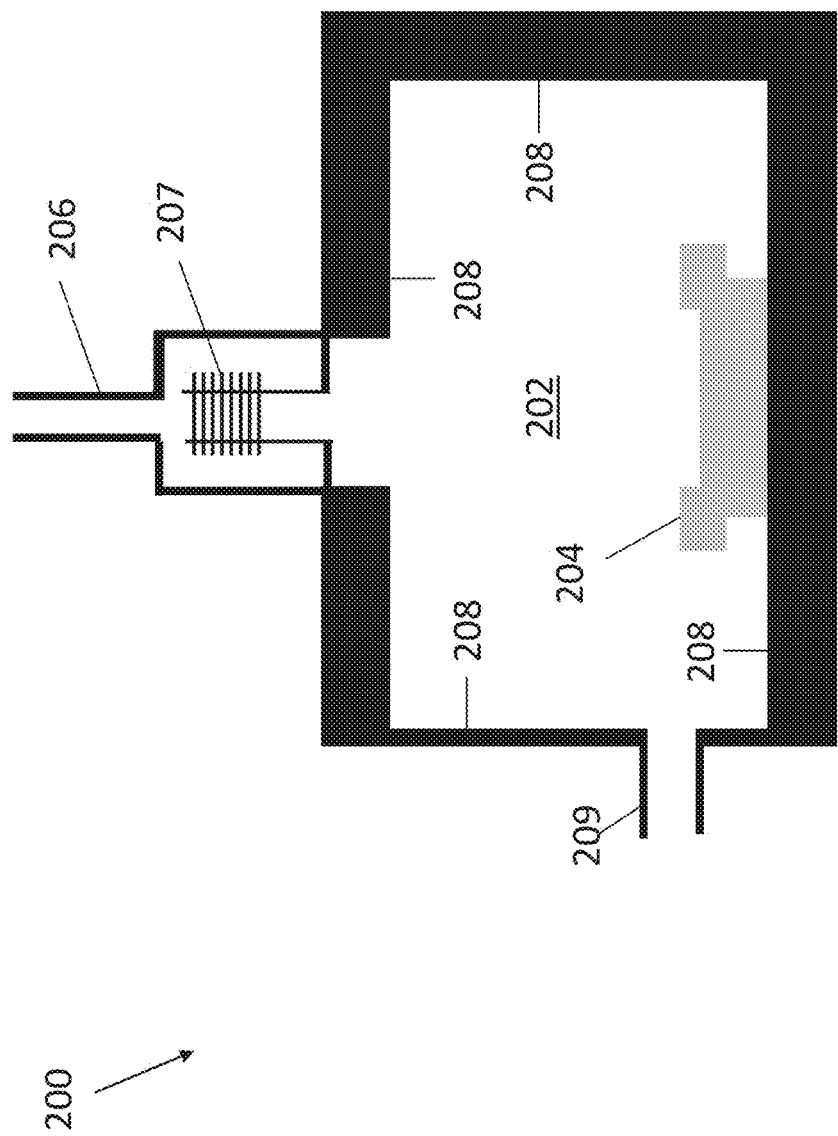
FIG. 2 illustrates an etching tool, according to an embodiment.

Referring to FIG. 2, an etching tool 200 is depicted, according to an embodiment. Generally speaking, the etching tool 200 can be any commercially available semiconductor wafer processing tool that is designed to perform an etch process, such as plasma etching. The etching tool 200 includes an interior chamber 202, i.e., a three-dimensional space that is enclosed. A wafer chuck 204 is disposed within the interior chamber 202. The wafer chuck 204 is an apparatus that receives a single semiconductor wafer and securely retains the wafer in place, e.g., by a vacuum mechanism, while the wafer is being processed. The etching tool 200 includes a mechanism 206 for introducing process gas, into the interior chamber 202. The etching tool 200 may also include an RF coil 207 for generating a plasma from process gas. The etching tool 200 may also include an RF coil 207 for generating a plasma from process gas and an exhaust mechanism 209 for removing process gasses from the interior chamber 202.

Figure 3:
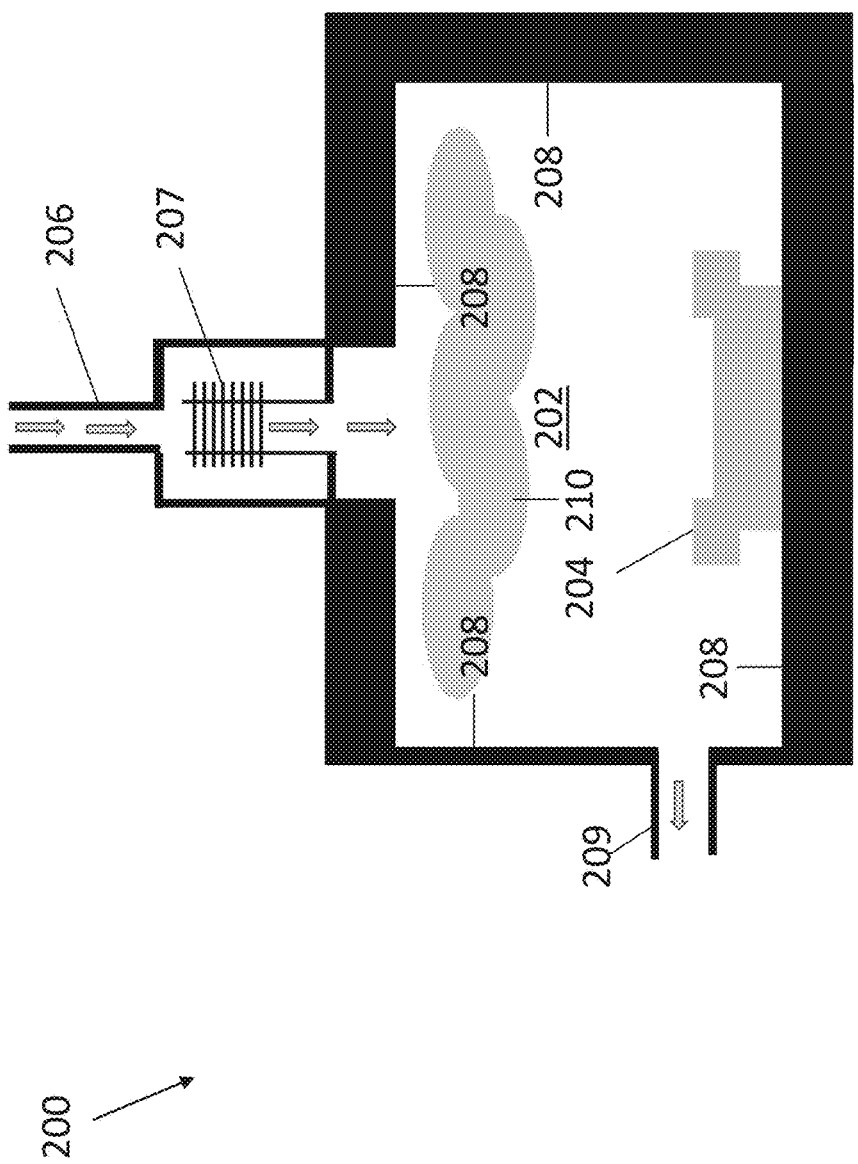
FIG. 3 illustrates a preliminary contamination control process that includes introducing a first process gas into the interior chamber of the etching tool, according to an embodiment.

Referring to FIG. 3, a preliminary contamination control process for coating interior surfaces 208 of the etching tool 200 is depicted, according to an embodiment. This preliminary contamination control process is performed prior to the etching of a semiconductor wafer. According to an embodiment, the preliminary contamination control process is performed without any semiconductor wafer being present in the interior chamber 202. The preliminary contamination control process includes introducing a first process gas 210 into the interior chamber 202. The first process gas 210 is introduced using a mechanism 206 (e.g., a chute) that is in open communication with the interior chamber 202. Generally speaking, the first process gas 210 can include any gas that forms a substantially oxygen free polymer. Examples of these process gasses include carbon and hydrogen containing gasses or plasmas. More particularly, the first process gas 210 can include a $C_xH_y$ containing gas mixture or a $C_xH_yCl_z$ containing gas mixture. According to one embodiment, the first process gases 210 is $C_2H_4$. According to an embodiment, the first process gas first process gas 210 is energized into a plasma state, e.g., using the RF coil 207.

Figure 4:
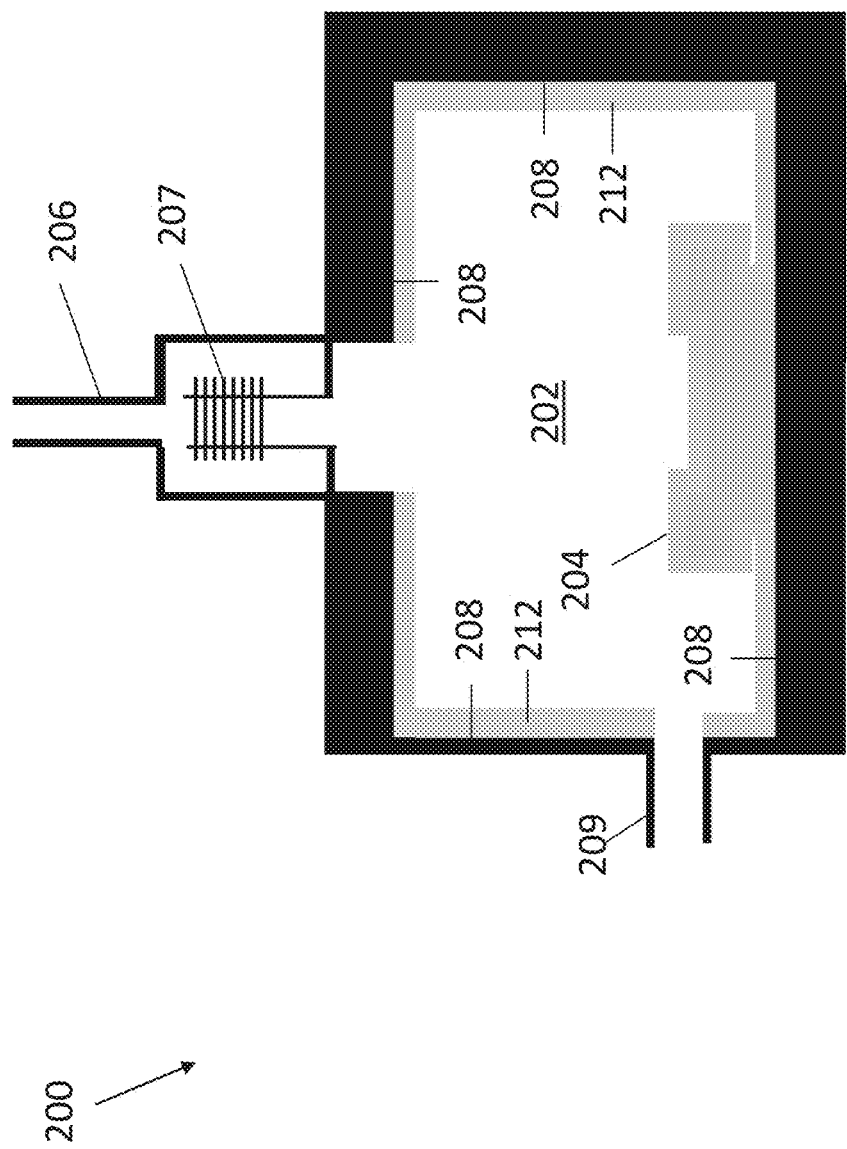
FIG. 4 illustrates a protective layer that forms along interior surfaces of the etching tool as a result of the first process gas, according to an embodiment.

Referring to FIG. 4, as a result of the first process gas 210 being introduced into the interior chamber 202 and being transformed into a plasma as described with reference to FIG. 3, a protective layer 212 is formed along exposed interior surfaces 208 of the interior chamber 202. Generally speaking, the parameters of the preliminary contamination control process can be selected such that the fully formed protective layer 212 is partially or completely removed after one etching and ashing sequence, such as the etching and ashing steps to be described in further detail below with reference to FIGS. 5 and 6. The thickness of the protective layer 212, which is dependent upon the parameters of the process described with reference to FIG. 3 (e.g., time and temperature of exposure to the first process gas 210), can be selected to be relatively thin. For example, the protective layer 212 can be formed to be about 1 nm (nanometer)-1 μm (micron, and more particularly about 100 nm-500 nm. These thicknesses provide adequate protection for at least one, and in some cases, only one, etching and ashing sequence. The material composition of the protective layer 212 is correlated to the composition of the first process gas 210. Using the carbon and hydrogen containing gases described above as exemplary first process gasses 210, these gasses form a carbon-based polymer, such as along the interior surfaces 208 of the interior chamber 202. Generally speaking, the carbon-based polymer can be any polymer containing carbon (C), hydrogen (H), and chlorine (Cl). For example, the carbon-based polymer can be a carbon and hydrogen based polyethylene ($C_2H_4$) or variants thereof. These carbon-based polymers serve to protect the interior surfaces 208 of the interior chamber 202 while absorbing oxygen during an etching step.

The technique for forming the protective layer 212 illustrated in FIGS. 3 and 4 is an in-situ process. As used herein, an in-situ process refers to a processing technique whereby the material that forms the protective layer 212 is introduced into the interior chamber 202 in the form of a process gas that is fed through the process gas mechanism 206 of the etching tool 200. That is, the material that ultimately forms the protective layer 212 enters the interior chamber 202 in a gaseous or plasma state, and eventually accumulates in a solid state along exposed interior surfaces 208 of the interior chamber 202. By way of comparison, an ex-situ technique refers to a technique whereby an extraneous object is used to introduce a foreign material into the interior chamber 202. For example, an ex-situ technique encompasses a technique whereby a dummy wafer containing a foreign material is placed in the interior chamber 202 and subsequently etched, resulting in a residue of the foreign material coating the interior chamber 202. Thus, whereas an in-situ technique utilizes the inherent plasma generation functionality of the etching tool 200 to coat the interior chamber 202, an ex-situ technique requires an extraneous article to coat the interior chamber 202.

Figure 5:
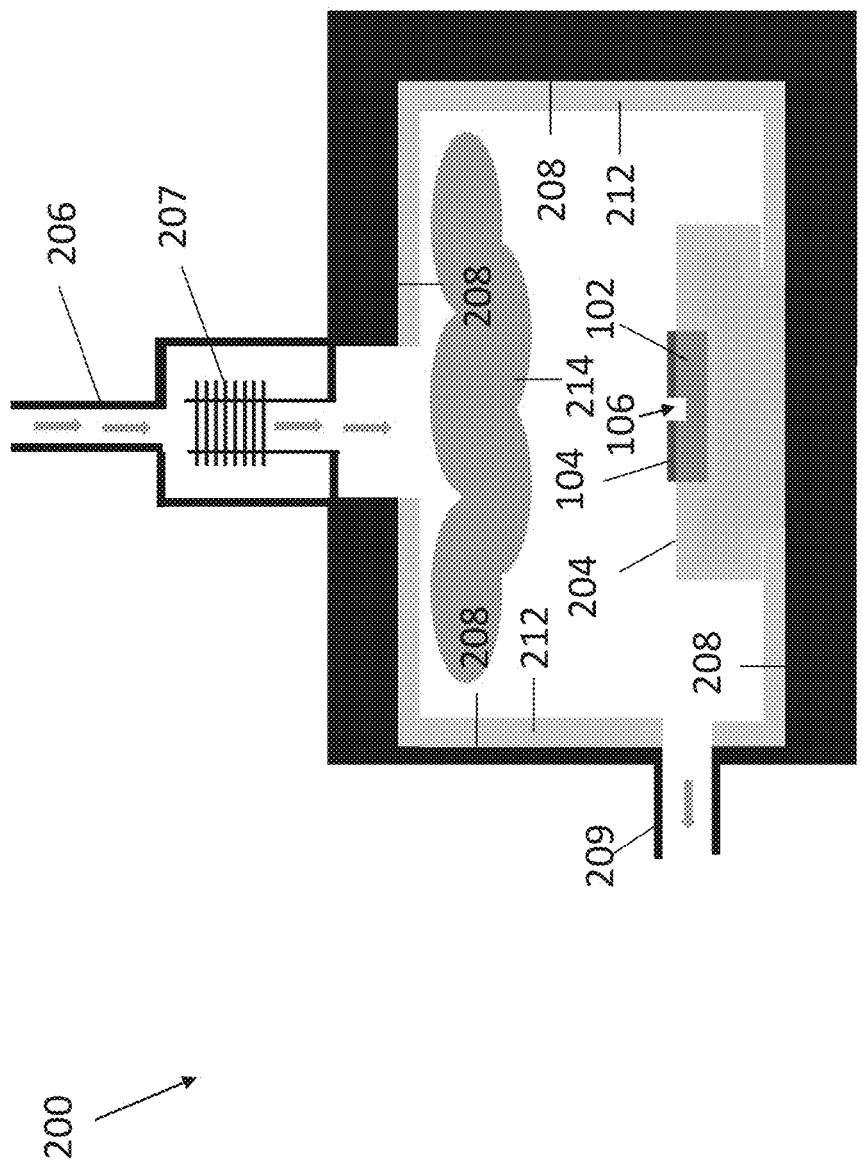
FIG. 5 illustrates etching a semiconductor wafer with the protective layer covering the interior surfaces of the etching tool, according to an embodiment.

Referring to FIG. 5, after forming the protective layer 212, an etching step of the process cycle is performed. This process step includes inserting one of the semiconductor wafers 102 of the wafer lot 100 into the interior chamber 202 of the etching tool 200. The semiconductor wafer can be secured to the wafer chuck 204 in a commonly known manner. The semiconductor wafer can include a patterned mask 104 that covers an upper surface of the semiconductor wafer 102 in certain locations and exposes the upper surface of the semiconductor wafer 102 in the patterned region of the mask 104. The mask 104 can be formed from any of a wide variety of conventionally known masking materials, including photoresist materials and oxides. After the semiconductor wafer 102 is inserted into the interior chamber 202, a second process gas 214 is introduced into the interior chamber 202 using the mechanism for introducing process gas. Generally speaking, the second process gas 214 can be any energized gas that is capable of reacting with the material of the semiconductor wafer 102, selective to the material of the mask 104, so as to remove material away from the unmasked portion of the semiconductor wafer 102. Examples of these process gasses include fluorine and chlorine containing gasses, such as fluorine and chlorine. According to an embodiment, the second process gas 214 is in a plasma state. As a result of the etching step, a recess 106 is formed at the upper surface of the semiconductor wafer 102.

Due to the presence of the protective layer 212 in the interior chamber 202 of the etching tool 200, none of the interior surfaces 208 of the etch chamber react with the second process gas 214. Thus, the presence of contaminants in the interior chamber 202 of the etching tool 200 in subsequent processing steps is minimized.

Figure 6:
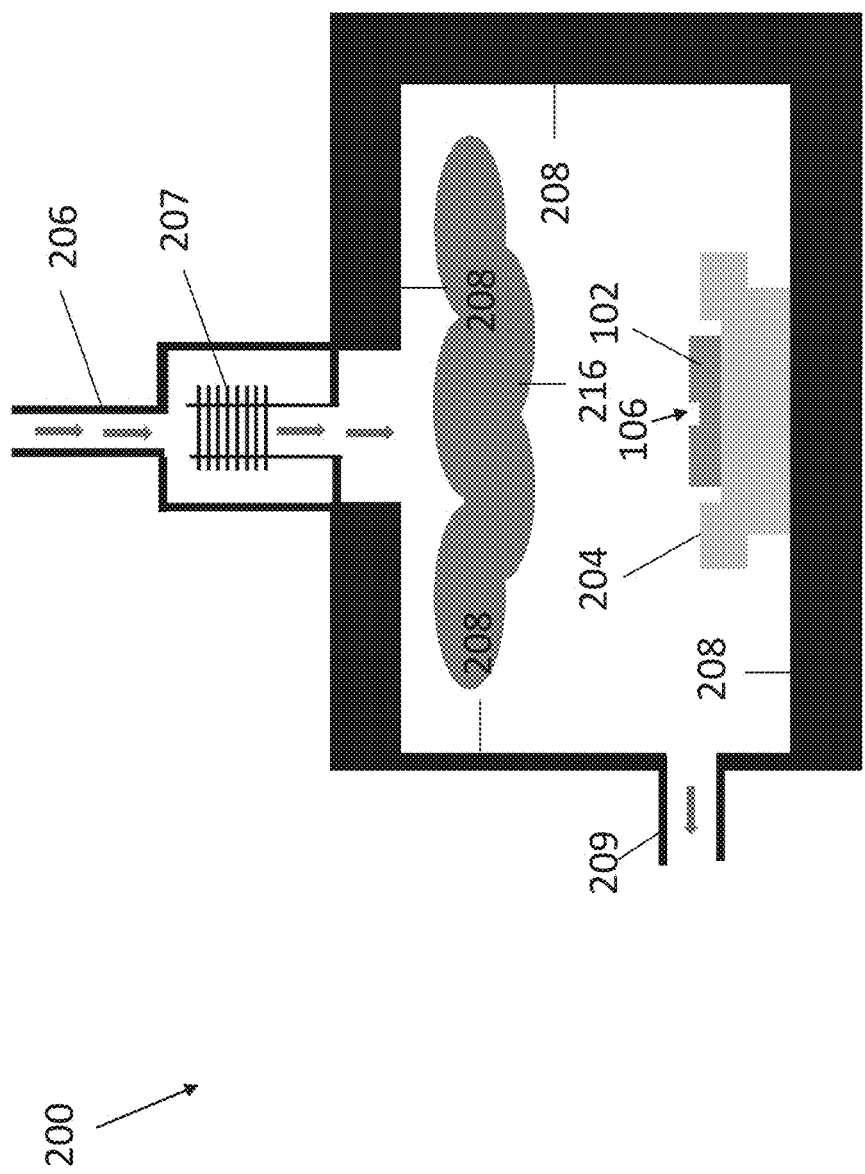
FIG. 6 illustrates an ashing step to remove a mask from the semiconductor wafer, according to an embodiment.

Referring to FIG. 6, after etching the semiconductor wafer, an ashing step of the process cycle can be performed. The ashing step includes introducing a third process gas 216 into the interior chamber 202 using the mechanism 106 for introducing process gas. In general, the third process gas 216 can be any gas which, as a plasma, is capable of removing the material of the mask 104, selective to the material of the semiconductor wafer 102. For example, according to an embodiment, third process gas 216 is an oxygen (02) based plasma. As a result of the ashing step, the protective layer 212 is thinned, and contaminants from the protective layer 212 are removed. In some cases, the ashing step may result in partial or complete removal of the protective layer 212 from the exposed interior surfaces 208 of the etch chamber. As a result, the presence of contaminants in the interior chamber 202 of the etching tool 200 in subsequent processing steps is minimized. In addition, the ashing step may partially or completely remove the mask 104 is removed from the semiconductor wafer 102. Alternatively, the semiconductor wafer 102 can be removed prior to the above described ashing step.

After performing the ashing step described with reference to FIG. 6, the semiconductor wafer 102 is removed from the interior chamber 202 of the etching tool 200. Subsequently, the process cycle described with reference to FIGS. 3-6 can be repeated for some or all of the wafers 102 in the wafer lot 100. That is, the preliminary contamination control process described with reference to FIGS. 3 and 4 can be performed again without any wafer being present in the interior chamber 202. Subsequently, an additional one of the semiconductor wafers 102 in the wafer lot 100 can be inserted in the interior chamber 202 and the etching and ashing steps described with reference to FIGS. 5 and 6 can be performed.

Figure 7:
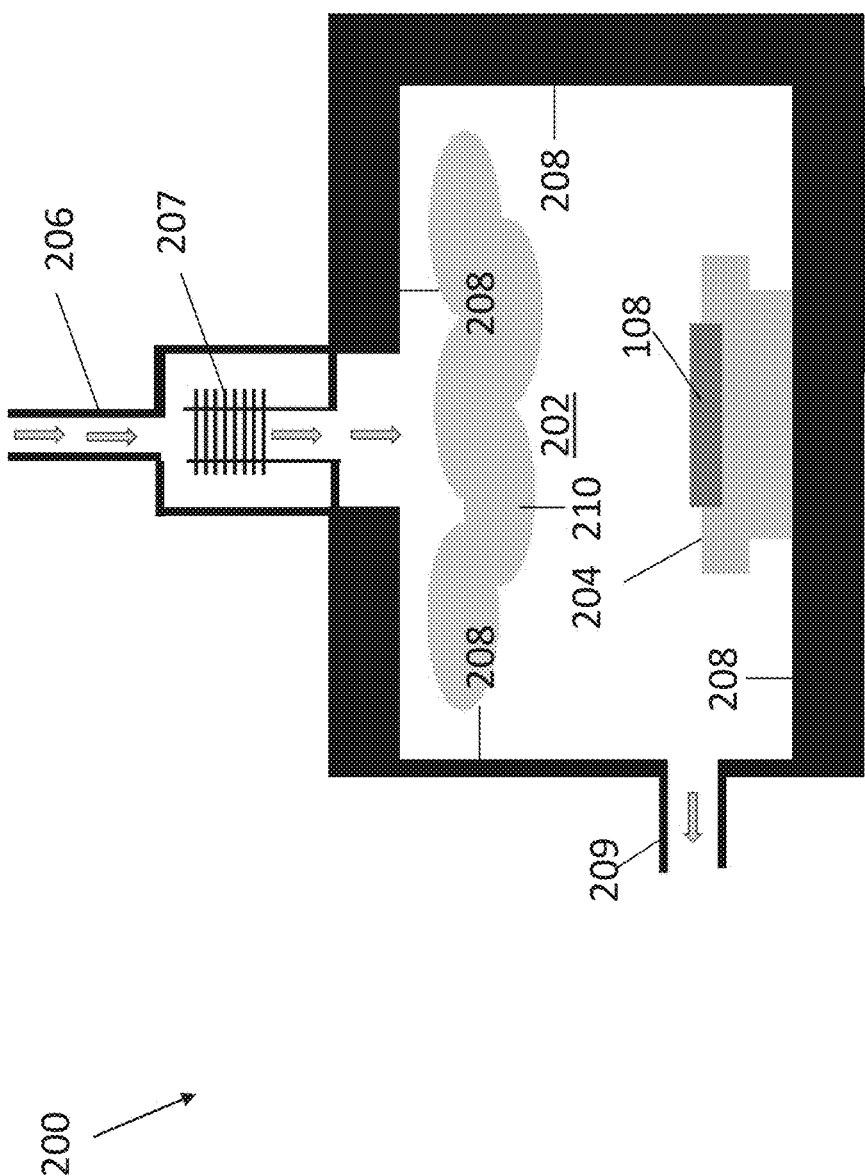
FIG. 7 illustrates a preliminary contamination control process that includes introducing a first process gas into the etching tool, according to another embodiment.
Figure 8:
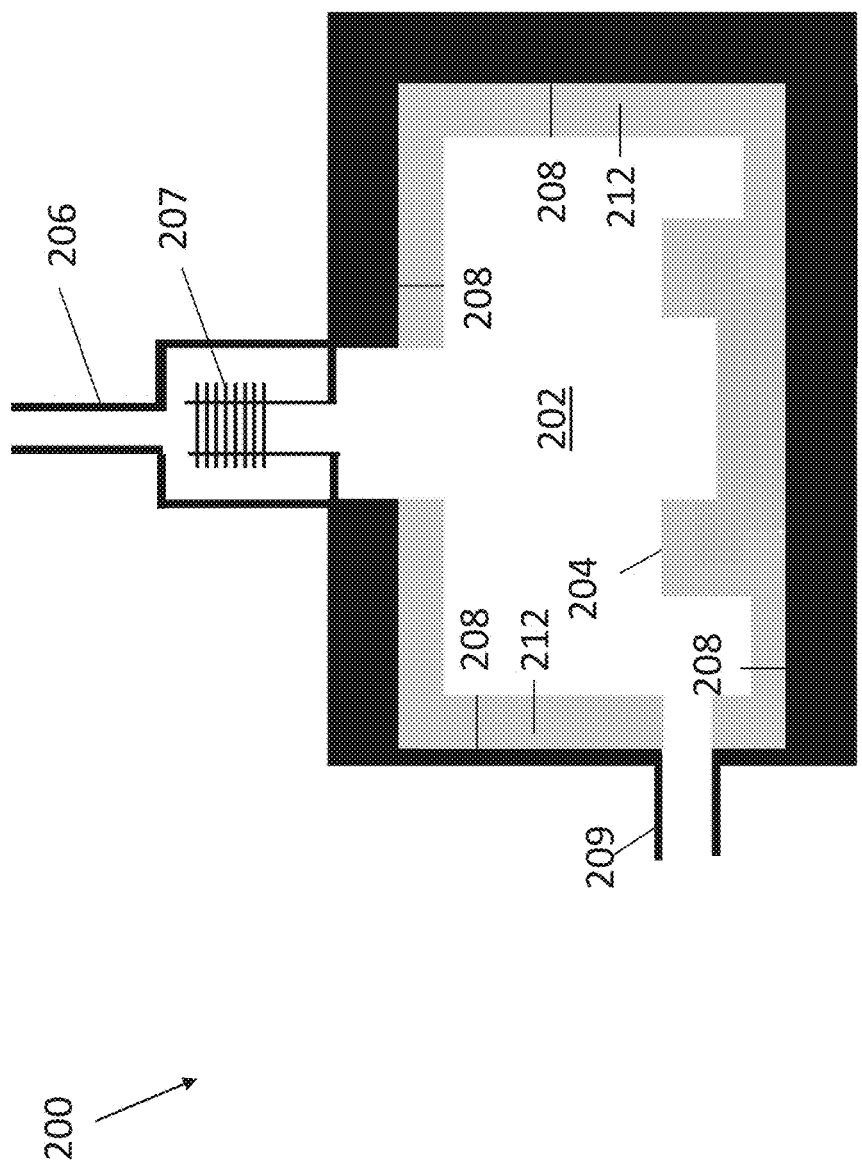
FIG. 8 illustrates a protective layer that forms along interior surfaces of the etching tool as a result of the first process gas, according to another embodiment.

FIGS. 7 and 8 depict an alternate embodiment of the preliminary contamination control process. Different to the technique described with reference to FIGS. 3 and 4, the technique described with reference to FIGS. 7 and 8 is designed to withstand at least two etching cycles.

Referring to FIG. 7, a first process gas 210 is introduced into the interior chamber 202 in a similar manner as described with reference to FIGS. 3 and 4. The first process gas 210 can include carbon and hydrogen containing gasses such as a $C_xH_y$ containing gas mixture or a $C_xH_yCl_z$ containing gas mixture. The first process gas 210 is introduced using a mechanism 206 that is in open communication with the interior chamber 202.

According to an embodiment, a dummy wafer 108 is situated in the wafer chuck 204 during the introduction of the first process gas 210. The dummy wafer 108 acts as a physical placeholder that covers the wafer chuck 204. As a result, the wafer chuck 204 is not exposed to the first process gas 210. The dummy wafer 108 can be formed from different materials as the semiconductor wafers 102 of the wafer lot 100. The dummy wafer 108 can include any of a wide variety of materials, and is not necessarily semiconducting.

Referring to FIG. 8, after sufficient time and temperature of exposing the first process gas 210 to the interior chamber 202, a protective layer 212 is formed in the interior chamber 202 of the etching tool 200. Different to the preliminary contamination control process described with reference to FIGS. 3 and 4, in this embodiment, the parameters of the preliminary contamination control process are selected such that the fully formed protective layer 212 is sufficiently thick to withstand more than one etching and ashing sequences, such as the etching and ashing steps described with reference to FIGS. 5 and 6. For example, the protective layer 212 can be formed to be about 500 nm-2 μm thick, which is suitable to withstand two etching and ashing sequences. Moreover, the material composition of the protective layer 212, which is correlated to the composition of the first process gas 210 can be selected to provide a protective layer 212 that is able to withstand at least two of the etching and ashing sequences. In the embodiments in which the dummy wafer 108 is situated in the wafer chuck 204 during the exposure to the first process gas 210, the protective layer 212 forms on the dummy wafer 108 and not the receptacle portion of the wafer chuck 204. Thus, as depicted in FIG. 8, when the dummy wafer 108 is removed from the wafer chuck 204, the receptacle portion of the wafer chuck 204 is devoid of the protective layer 212.

The preliminary contamination control process described with reference to FIGS. 7 and 8 allow for the preliminary contamination control process step to be omitted in at least some of the process cycles for each wafer lot 100. That is, after performing the preliminary contamination control process described with reference to FIGS. 7-8, the process steps described with reference to FIGS. 5 and 6 can be performed on a first semiconductor wafer 102 in the wafer lot 100 and can be repeated immediately thereafter on a second semiconductor wafer 102 in the wafer lot 100. For example, according to an embodiment, the preliminary contamination control process described with reference to FIGS. 7 and 8 is performed once for each three semiconductor wafers 102 that are etched.

The technique described with reference to FIGS. 7-8 offers certain advantages in that the cycle time per wafer can be reduced in comparison to the technique described with reference to FIGS. 3-6, as the preliminary contamination control process is not performed each cycle. On the other hand, the sufficiently higher thickness values of the protective layer 212 that are required in the technique of FIGS. 7-8 so that the protective layer 212 can withstand multiple etching and ashing sequences may require the use of the dummy wafer 108 to protect the receptacle portion of the wafer chuck 204. Without the dummy wafer 108, the protective layer 212 that forms on the receptacle portion can interfere with the mechanical and thermal connection between the semiconductor wafer 102 and the wafer chuck 204. By contrast, the dummy wafer 108 can be omitted in the technique described with reference to FIGS. 3-6 because the thinner protective layer 212 of this embodiment is less likely to interfere with the mechanical and thermal connection between the semiconductor wafer 102 and the wafer chuck 204. In other words, each technique offers different advantages and drawbacks, and selection of one technique over another is dependent on a variety of factors, such as composition of the protective layer 212, number of wafers 102 in the wafer lot 100, etc.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of fabricating a type III-V semiconductor device, the method comprising:
    providing an etching tool that comprises an interior chamber;
    providing a plurality of type III-V semiconductor wafers;
    performing a process cycle for each one of the type III-V semiconductor wafers in the plurality, the process cycle comprising:
        performing a preliminary contamination control process;
        inserting one of the type III-V semiconductor wafers into the interior chamber;
        etching type III-V semiconductor material away from the type III-V semiconductor wafer that is present in the interior chamber; and
        removing the type III-V semiconductor wafer that is present in the interior chamber,
    wherein the preliminary contamination control process comprises forming a carbon containing protective material that covers exposed surfaces of the interior chamber.

2. The method of claim 1, wherein the preliminary contamination control process comprises an in-situ process wherein a first process gas is introduced into the into the interior chamber, the first process gas forming the carbon containing protective material.

3. The method of claim 2, wherein the preliminary contamination control process of the process cycle is performed without any wafer being present in the interior chamber.

4. The method of claim 2, wherein the process cycle further comprises:

performing an oxygen based ashing step after the etching of the type III-V semiconductor material away from the type III-V semiconductor wafer that is present in the interior chamber,
wherein the oxygen based ashing step at least partially removes the carbon containing protective material from the inner sidewalls of the interior chamber.

5. The method of claim 1, wherein the first process gas comprises at least one of: a $C_xH_y$ containing gas mixture, and a $C_xH_yCl_z$ containing gas mixture.

6. The method of claim 5, wherein the first process gas comprises $C_2H_4$.

7. A method of fabricating a type III-V semiconductor device, the method comprising:
providing an etching tool that comprises an interior chamber;
forming a carbon containing protective material that covers exposed surfaces of the interior chamber;
inserting a first type III-V semiconductor wafer into the interior chamber with the protective material covering the exposed surfaces of the interior chamber;
etching type III-V semiconductor material away from the first type III-V semiconductor wafer that is contained within the interior chamber while the protective material covers the exposed surfaces of the interior chamber;
performing a first oxygen based ashing step to at least partially remove the protective material from the exposed surfaces of the interior chamber;
wherein the preliminary contamination control process comprises an in-situ process wherein a first process gas is introduced into the interior chamber, the first process gas forming the carbon containing protective material.

8. The method of claim 7, wherein the first process gas comprises at least one of: a $C_xH_y$ containing gas mixture, and a $C_xH_yCl_z$ containing gas mixture.

9. The method of claim 8, wherein the first process gas comprises $C_2H_4$.

10. The method of claim 7, wherein the forming of the carbon containing protective material is performed without any wafer being present in the interior chamber.

11. The method of claim 7, wherein performing the first oxygen based ashing step at least partially removes the protective coating from the interior walls of the interior chamber.

12. The method of claim 11, wherein performing the first oxygen based ashing step substantially completely removes the protective coating from the interior walls of the interior chamber.

13. The method of claim 7, further comprising, after performing the first oxygen based ashing step:
removing the first type III-V semiconductor wafer from the interior chamber;
inserting a second type III-V semiconductor wafer into the interior chamber with the protective material covering the exposed surfaces of the interior chamber;
etching type III-V semiconductor material away from the second type III-V semiconductor wafer that is contained within the interior chamber while the protective material covers the exposed surfaces of the interior chamber; and
performing a second oxygen based ashing step to remove the protective material from the exposed surfaces of the interior chamber.

14. The method of claim 13, wherein the carbon containing protective material is formed before inserting the first type III-V semiconductor wafer into the interior chamber and is not formed after removing the first type III-V semiconductor wafer from the interior chamber, and wherein the carbon containing protective material is formed to be sufficiently thick such that the protective coating completely covers the exposed surfaces of the interior chamber after both the first oxygen based ashing step and the second oxygen based ashing step.

15. The method of claim 14, wherein the etching tool comprises a wafer chuck, and wherein the carbon containing protective material is formed with a dummy wafer being present in the wafer chuck.

16. A method of conditioning an etch chamber for each processing cycle during the processing of multiple III-V semiconductor wafers, the method comprising:
depositing a polymer coating on an inner surface of the etch chamber via a carbon-containing plasma present in the etch chamber without a III-V semiconductor wafer in the etch chamber;
removing the polymer coating from the inner surface of the etch chamber after a single III-V semiconductor wafer is processed in the etch chamber; and
repeating the polymer coating deposition and removal processes for each subsequent III-V semiconductor wafer to be processed in the etch chamber.

17. The method of claim 16, wherein the polymer coating is an and carbon containing protective material.

18. The method of claim 16, wherein removing the polymer coating from the inner surface of the etch chamber comprises performing an oxygen based ashing step after the single III-V semiconductor wafer is processed in the etch chamber.

19. The method of claim 16, wherein the carbon-containing plasma comprises at least one of: a $C_xH_y$ containing gas mixture, and a $C_xH_yCl_z$ containing gas mixture.

20. The method of claim 16, wherein the carbon-containing plasma comprises $C_2H_4$.

* * * * *

UNITED STATES PATENT AND TRADEMARK OFFICE
CERTIFICATE OF CORRECTION

PATENT NO.        : 10,128,133 B1
APPLICATION NO.   : 15/638558
DATED             : November 13, 2018
INVENTOR(S)       : A. Haghofer et al.

Page 1 of 1

It is certified that error appears in the above-identified patent and that said Letters Patent is hereby corrected as shown below:

In the Claims

At Column 8, Line 59 (Claim 2, Line 3), please delete "into the" after the.

Signed and Sealed this
Twenty-second Day of January, 2019

Andrei Iancu
*Director of the United States Patent and Trademark Office*